United States Patent
Degani et al.

[11] Patent Number: 5,990,564
[45] Date of Patent: Nov. 23, 1999

[54] FLIP CHIP PACKAGING OF MEMORY CHIPS

[75] Inventors: Yinon Degani, Highland Park; Thomas Dixon Dudderar, Chatham; King Lien Tai, Berkeley Heights, all of N.J.

[73] Assignee: Lucent Technologies Inc., Murray Hill, N.J.

[21] Appl. No.: 08/866,264

[22] Filed: May 30, 1997

[51] Int. Cl.[6] .......................... H01L 23/50; H01L 23/48; H05K 7/02; H05K 3/34
[52] U.S. Cl. .......................... 257/778; 257/723; 257/686; 257/724; 257/777; 257/737; 257/738; 29/832; 29/840; 361/764; 361/735; 361/783
[58] Field of Search .......................... 257/737, 734, 257/738, 723, 778, 686, 713, 724, 648, 691, 692, 693, 697, 700, 712, 727; 361/764, 735, 783, 760, 744; 29/840, 832; 174/52.4, 260

[56] References Cited

U.S. PATENT DOCUMENTS

| | | | |
|---|---|---|---|
| 4,604,644 | 8/1986 | Beckham et al. | 257/779 |
| 4,871,914 | 10/1989 | Simon et al. | 250/253 |
| 5,360,988 | 11/1994 | Uda et al. | 257/529 |
| 5,382,300 | 1/1995 | Blonder et al. | 148/24 |
| 5,397,747 | 3/1995 | Angiulli et al. | 257/738 |
| 5,406,025 | 4/1995 | Carlstedt | 29/832 |
| 5,477,067 | 12/1995 | Isamura et al. | 257/903 |
| 5,483,421 | 1/1996 | Gedney et al. | 361/771 |
| 5,615,477 | 4/1997 | Sweitzer | 29/840 |
| 5,629,838 | 5/1997 | Knight et al. | 361/782 |
| 5,646,828 | 7/1997 | Degani et al. | 29/832 |
| 5,718,361 | 2/1998 | Braun et al. | 228/56.3 |
| 5,718,367 | 2/1998 | Covell, II et al. | 228/254 |

*Primary Examiner*—Alexander Oscar Williams

[57] ABSTRACT

The specification describes an interconnect strategy for memory chip packages to reduce or eliminate alpha particle contamination from the use of high lead solder interconnections in the vicinity of semiconductor memory cells. In the primary embodiment a high tin solder is recommended. A multi-layer under bump metallization is described that is compatible with high tin solders and flip-chip solder bump technology.

16 Claims, 2 Drawing Sheets

FLIP CHIP PACKAGING OF MEMORY CHIPS

FIELD OF THE INVENTION

This invention relates to packaging memory chips and in particular to new designs for flip chip packages which protect memory arrays from alpha particle hazards.

BACKGROUND OF THE INVENTION

The susceptibility of dynamic random access (DRAM) and static random access (SRAM) devices to alpha particle degradation has long been recognized. The problem was discovered early in the evolution of semiconductor memory devices but has become severe since the advent of very high density MOS transistor memory arrays. These arrays store data in the form of electrons or holes (usually electrons in n-channel devices) and a very few charges represent a data bit in a very high density array. Thus a single alpha particle "hit" in a storage capacitor of one of these devices will generate enough hole-electron pairs that the charge state of a capacitor in e.g. the "zero" state (no charge) will be read as a "one".

A variety of approaches have been used for protecting these devices from alpha particle exposure, typically from alpha particle sites outside the device package. Thus packaging designs are known which shield the package contents, i.e. the memory arrays, from alpha particle exposure. It has also been recognized that certain types of device packages, e.g. certain metal containers, can be sources of alpha particle contamination and either are to be avoided, or steps taken to insulate the chip from the alpha particle source. Generally, the art of memory chip packaging is well developed and the conventional memory chip packages are largely free of alpha particle problems.

Standard memory chip packages, which now have essentially proven alpha particle immunity, are dual in-line packages, and more recently, surface mount quad packages. Both of these device packages often use solder connection between the leads or pads on the encapsulated IC, and printed wiring boards or other interconnect substrates. Typically the solder is standard lead-tin solder.

The conventional memory packages, i.e. die- and wire-bonded leaded packages, impose a cost in terms of performance and size that is now being seen as too high for certain applications, and more sophisticated memory chip packaging approaches are sought. For many years the trend in semiconductor device and package design was in ever higher levels of integration, which in memory technology took the form of integrating memory and logic on the same chip. Power modules and driver circuits are conventionally part of DRAM and SRAM devices, and many memory device designs have application specific logic embedded with the memory arrays on a common chip. However, while logic and memory semiconductor elements share many common features, there are differences. For example, a critical feature of a memory element is the storage capacitor. This element must be made optimally small, and essentially without defects or leakage. Logic devices have no comparable element, and are more forgiving in some device aspects. Consequently a wafer fabrication process that is tailored for memory device optimization is not usually optimum for logic devices. Thus, compromises are made in order to have different device species on the same semiconductor chip.

Current developments are proceeding in the direction of "disintegration", where memory devices consist mainly of memory cells, and the "on-board" logic and other transistors are put on another chip. These chips can be processed optimally for the size and nature of their components. In this technology, the "integration" is performed at the package level, and the key to its success is a packaging technology that produces a final product that is superior to a chip integrated system in performance and cost, and at least comparable in size.

A leading candidate for this packaging technology is flip chip bonding and assembly. Flip chip bonding is a well developed technology and is characterized by bonding bare silicon IC die upside down on an interconnect substrate such as a printed wiring board. Several bonding techniques have been developed, e.g. ball bonding, ball grid array (BGA—a form of ball bonding), and solder bump bonding. These techniques lead to reduced I/O pitch through smaller contact surfaces, and area rather than perimeter interconnection arrays. Moreover, electrical performance is enhanced because lead lengths are reduced. Typically, the bonding method in these techniques is solder bonding.

We have recognized that the miniaturization of interconnections in these advanced technologies introduces new and unexpected consequences. Essentially unknown to the developers of wire bonds, and extended leads typical of through mounted and surface mounted packages, is that the leads in these techniques are inherently long enough to provide beneficial isolation of the active circuit elements, i.e. transistors, from alpha particle sources in the solder interconnections. As those leads are shortened, as they are in the improved technologies described above, the active elements of the ICs are brought closer to the solder interconnections. We have recognized that a consequence of very close proximity of a solder interconnection to a susceptible IC component is that alpha particles emitted from the solder can impact the semiconductor substrate in the vicinity of the active element and cause alpha particle damage as described earlier. The alpha particle problem is most severe when the interconnection comprises a lead based solder.

One approach to overcoming the alpha particle problem is to locate the I/O leads far enough away from the susceptible circuit elements to spatially isolate the latter from alpha particles emitted from the solder. To some extent this is achievable in large packages with perimeter I/O pads. However, in the new packaging technologies of interest to state of the art designers, the best interconnection approaches use area arrays of I/O pads, where I/O pads are located directly adjacent potentially susceptible circuit elements. Moreover, even perimeter I/O pads are situated very close to active elements in the very small packages currently being designed.

STATE OF THE INVENTION

With the recognition of the alpha particle problem that is now associated with flip-chip interconnection of memory chips, and particularly in flip-chip packages that contain a memory chip in a multi-chip package, we have devised an interconnected strategy which has produced advanced flip-chip interconnect packages that reduce or eliminate the alpha particle problem. This strategy, and the resulting package designs, are based on the elimination of lead-based solders. We have also developed a more robust pad metallization adapted for lead-free solders. Since the primary pad material in virtually all ICs is aluminum (part of the last metal interconnect level of the IC), the aluminum pads must be coated with a solder compatible material prior to solder bonding the chip to a substrate. In solder bump interconnect methods, which are the preferred embodiments of this invention, the solder compatible material is referred to as under bump metallization (UBM). Existing UBM materials are tailored for lead solders. Thus we have devised new under bump materials for use with low lead or lead free solders used in the interconnect strategy of this invention.

DETAILED DESCRIPTION

Figure 1:
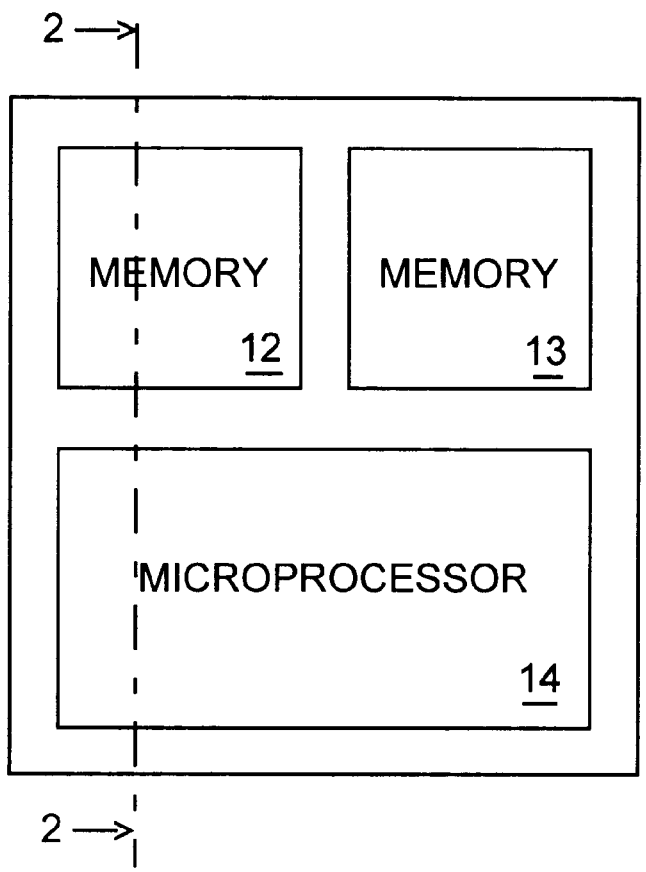
FIG. 1 is a plan view of a multi-chip package containing memory chips.

Referring to FIG. 1, a schematic plan view of a multi-chip module (MCM) tile is shown with interconnection substrate 11 and three semiconductor chips 12, 13, and 14 bonded to the substrate. Chips 12 and 13 are memory chips, as indicated, and chip 14 is a logic chip, e.g., a microprocessor. The interconnection substrate 11 may be a ceramic, a semiconductor wafer such as silicon, an epoxy board, or other suitable substrate. It may be single or multi-layer, and may itself be interconnected to another interconnection substrate. The invention is applicable to any IC package containing at least one memory chip, and is most advantageously used where the memory chip is interconnected to the immediate substrate supporting the memory chip with fine pitch area arrays as will be described in more detail below. Alternatively, the memory chip can be flip-chip bonded by the described technique to another chip or component that in turn is bonded to the interconnect substrate. Such multi-chip arrangements are known in the art.

The memory chip may be a static random access memory (SRAM), dynamic access memory (DRAM) or other memory type that stores data in a semiconductor in the form of electrical charge. The invention particularly addresses memory devices in which very few charges represent a data bit, i.e. the charge is stored in a very small capacitor. This condition prevails in memory devices at the megabit level and higher, i.e. at least a million transistors per chip.

Figure 2:
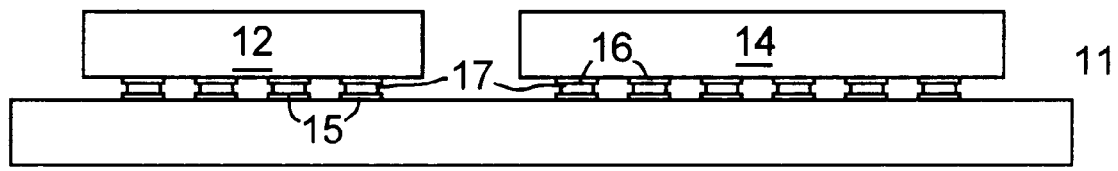
FIG. 2 is a section view at 2—2 of FIG. 1.

The interconnection for the multi-chip arrangement of FIG. 1 is shown in more detail in the section view of FIG. 2, taken along 2—2 of FIG. 1. Here bonding pads on the interconnect substrate are shown at 15, bonding pads on the chips at 16, and solder bump pillars at 17. The bonding pads 16 on the semiconductor chip are typically aluminum and are coated with under bump metallization to impart solderability as described earlier. The pads 16 shown on the substrate are typically part of a printed circuit and may or may not require a UBM for solderability. The solder pillars 17 are typically formed from solder bumps, although solder pads or balls, or solder paste, can also be used. As is known in the art, the space between the chip and the interconnect substrate and the pillars 17 can be filled with epoxy or other suitable material, often referred to as underfill, to seal this region and improve adhesion of the chip to the substrate. The use of an adhesive underfill is especially useful when bonding silicon chips to organic laminates to avoid bond failures in service due to differential thermal expansion between silicon substrate and the typical organic laminate materials. A preferred expedient to address this problem is to use a silicon interconnect substrate. The adhesive underfill should consist of a material that does not emit alpha particles.

The section 2—2 is taken across the interior of the chips 12 and 14, showing interior (area array) interconnections between the chips and interconnection substrate 11. The invention is most advantageously applied to memory chips with area array solder interconnections because the memory cells in this arrangement are most susceptible to alpha particle exposure from solder material located directly adjacent the cells.

A primary feature of the invention is the recognition of the deleterious effect of alpha particles that are emitted from conventional solders, and the susceptibility of high pitch area array interconnections to this deleterious effect. According to this aspect of the invention the solder used in bonding memory chips to interconnection substrates is essentially devoid of alpha particle emitting materials. Since lead is an alpha particle source, the invention involves the use of low lead or lead free solders. In the preferred embodiment the solder is lead free, but low quantities of lead, i.e. less than 5%, can be tolerated in some package configurations. Lead free solders that are recommended are tin based solders at or near eutectic points. Most tin based solders are higher melting than the eutectic tin-lead solders typically used in PWB assembly, so the process of the invention generally requires higher solder reflow temperatures. These temperatures are usually above the recommended processing temperature for conventional PWBs. Typically, FR4 PWBs will deteriorate if heated above 220° C. for a few minutes. To overcome this problem the PWB with a high melting point tin solder can be reflowed in an inert gas or, stated alternatively, in an oven that has low oxygen levels, i.e. <approximately 100 ppm. Since low reflow temperature are desirable, it is recommended that the lead free solder compositions be chosen at the eutectic point or within 5% thereof. Tin based solders that are especially suitable are given in the following table.

TABLE

| | COMPOSITION - wt. % | | | | |
|---|---|---|---|---|---|
| EXAMPLE | Sn | Sb | Ag | Bi | M.P. ° C. |
| I | 95.0 | 5.0 | | | 230 |
| II | 96.5 | | 3.5 | | 220 |
| III | 43.0 | | | 57.0 | 139 |

These lead-free compositions are given by way of example. The high tin solders typically have 75% or more tin, and preferably 90% or more tin. Other lead free solders may be used in this invention as well.

The preferred interconnection method for this invention uses flip-chip solder bump technology. The solder bumps are formed on arrays of I/O contact pads prior to assembly. To facilitate localized or selective application of solder to the array of contact pads, the surface of the pads should be solder wettable. The metal interconnection pattern typically used for integrated circuits is aluminum and, while techniques for soldering directly to aluminum have been tried, it is well known that aluminum is not a desirable material to solder. Consequently the practice in the industry is to apply a metal coating on the aluminum contact pads, and bond the solder bump or pad to the coating. As mentioned above, this coating is referred to as under bump metallization (UBM).

The metal or metals used in UBM technology must adhere well to aluminum, be wettable by typical solder formulations, and be highly conductive. A structure meeting these requirements is a composite of chromium and copper. Chromium is deposited first, to adhere to the aluminum, and copper is applied over the chromium to provide a solder wettable surface. Chromium is known to adhere well to a variety of materials, organic as well as inorganic. Accordingly it adheres well to dielectric materials, e.g. $SiO_2$, SINCAPS, polyimide, etc., commonly used in IC processing, as well as to metals such as copper and aluminum. However, solder alloys dissolve copper and de-wet from chromium. Therefore, a thin layer of copper directly on chromium will dissolve into the molten solder and the solder will then de-wet from the chromium layer. To insure interface integrity between the solder and the UBM, a composite or alloy layer of chromium and copper is typically used between the chromium and copper layers.

The aforementioned layers are conventionally sputtered, so several options for depositing them are conveniently available. The layer can be sputtered from an alloy target. It can be sputtered using a chromium target, then changing to a copper target. Or it can be sputtered using separate chromium and copper targets, and transitioning between the two. The latter option produces a layer with a graded composition, and is a preferred technique.

Techniques for patterning these layers, including etch processes, are given in copending application Ser. No. 08/825,923 filed Apr. 2, 1997 (Degani Case 31), which is incorporated by reference herein.

The melting point for eutectic Pb/Sn is approximately 40° C. lower than for the typical high tin solders used as the preferred embodiment of this invention. This factor, coupled with the high tin content, causes significant erosion of conventional UBM materials.

To avoid excessive erosion of UBM when using high tin solders a specific UBM layered structure has been developed. This special UBM has a five layer structure comprising a chromium layer and a copper layer with a relatively large transition layer. The transition layer preferably has a thickness of at least 4000 Angstroms and, in a preferred form, comprises three layers of mixed Cr/Cu.

Figure 3:
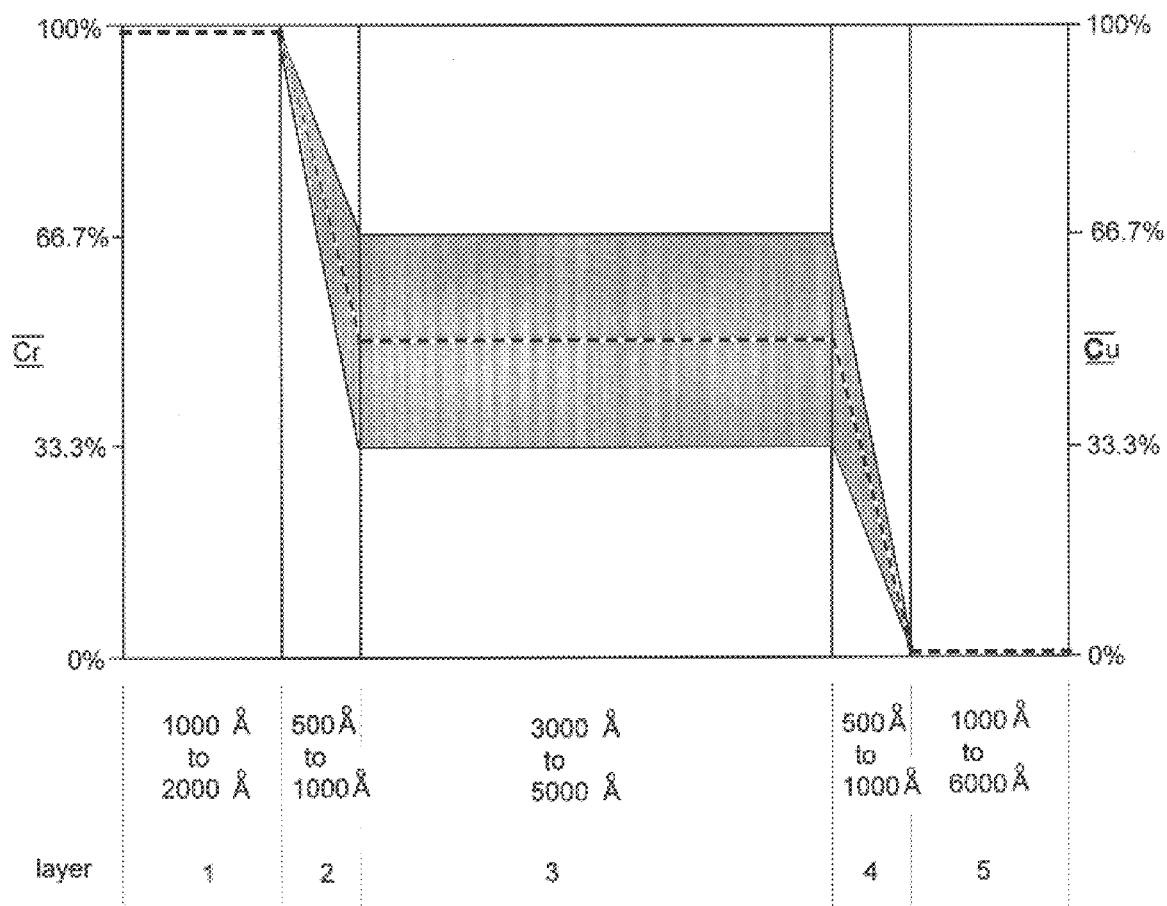
FIG. 3 is a schematic representation of the under bump metallization of the invention.

The preferred under bump metallization compositions are represented in FIG. 3. The UBM shown comprises five layers. Layer 1 is a chromium layer, 1000–2000 Angstroms in thickness, for adhesion to the underlying aluminum bonding pads. Layer 5 is a copper layer, 1000–6000 Angstroms in thickness, for solderability. Layers 2–4 represent the transition layers. The thickness of the transition layers, and the number of layers, can very significantly but the preferred ranges are those given. In layers 2 and 4, the relative amounts of chromium and copper are graded by, e.g. co-depositing chromium and copper, and varying the output of the chromium and copper sources. In the figure, the transition is essentially linear, and approximately linear is the preferred embodiment. However, non-linear gradations can also be used as long as the composition eventually transitions from approximately 100% chromium in layer 1 to chromium/copper with 33.3–66.7% chromium in layer 3, and from the composition of layer 3 to approximately 100% copper in layer 5. Normally this transition would be monotonic.

The preferred embodiment is a five layer structure essentially as shown as the dashed line in FIG. 3. This structure has approximately 1500 Angstroms Cr for layer 1, approximately 750 Angstroms for transition layer 2, approximately 4000 Angstroms of 50%—50% Cr/Cu for layer 3, approximately 750 Angstroms for transition layer 4, and 3000 Angstroms for copper layer 5. Variations from this preferred specification are preferably within the boundaries shown in the figure. The upper boundary defines a layered structure with a center layer of 66.7% Cr and the lower boundary defines a layered structure with a center layer of 66.7% Cu.

The range as shown in this figure is 33.3%–66.7% Cu, 33.3%–66.7% Cr. These are regarded as the essential ingredients, but other additions may be found useful by those skilled in the art.

The UBM described here is frequently surface coated with Au, or other relatively refractory or noble material to inhibit oxide formation on the copper surface of the UBM. This coating is optional.

Although the invention has been described in the context of flip-chip solder bump technology it is applicable to other varieties of interconnections, e.g. surface mount (SM), and ball grid arrays (BGA). These and other interconnect technologies typically use edge arrayed interconnections. However in future work modifications of these technologies may adapt them to use with area array interconnections, where at least a plurality of interconnection are arranged in the interior of the chip or element being interconnected. Edge arrayed interconnections typically have a single row of bond sites along one or more edges of the element being bonded. Arrangements where dual rows of bond sites are provided at and near the edge of the chip are considered in the context of this invention as area arrays, since the interior row bond sites on a memory package is likely to reside adjacent a alpha particle susceptible memory cell.

Although the invention has been described as particularly advantageous for area interconnections, in its broadest form it is applicable to edge arrayed interconnections. In some chip configurations bond sites even near the edge of the chip are still situated very close to memory cells, and high lead solder applied to those bond sites can be a source of harmful alpha particles. The invention in its basic form involves using low lead or lead free solder interconnections where lead solder is situated sufficiently close to a memory cell that alpha particle damage is a hazard. This can be defined most meaningfully in terms of the distance from the bond site to a charge storage site in a semiconductor memory capacitor, and a hazardous condition is present if that distance is less than 150 $\mu$m.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A memory chip package containing at least one semiconductor memory chip, wherein said memory chip contains MOS memory cells with semiconductor charge storage sites, and wherein said memory chip is mounted on an interconnect substrate using an area array of solder interconnections, and further wherein at least some of those solder interconnections are located within 150 microns of a semiconductor charge storage site, the invention characterized in that the solder material used for said solder interconnections is lead free and contains at least 75% tin.

2. The memory chip package of claim 1 in which the memory chip has at least a megabit storage capacity.

3. The memory chip package of claim 2 further including at least one logic chip.

4. The memory chip package of claim 1 in which the solder interconnections are solder bump interconnections.

5. The memory chip package of claim 4 in which the solder bumps are bonded to bonding pads on one or both the memory chip and the interconnection substrate.

6. The memory chip package of claim 5 in which at least some of said bonding pads are coated with under bump metallization.

7. The memory chip package of claim 6 in which the material of the under bump metallization comprises chromium and copper.

8. The memory chip package of claim 7 in which the under bump metallization comprises three layers having the following properties:
- layer 1 is formed on the bonding pad and consists essentially of 1000–2000 Angstroms of chromium,
- layer 2 is formed on layer 1 and consists essentially of at least 5000 Angstroms of chromium/copper, and
- layer 3 is formed on layer 2 and consists essentially of 1000–6000 Angstroms of copper.

9. The memory chip package of claim 7 in which the under bump metallization comprises five layers having the following properties:
- layer 1 is formed on said bonding pads and consists essentially of 1000–2000 Angstroms of chromium,
- layer 2 is formed on layer 1 and consists essentially of 500–1000 Angstroms of chromium/copper with a composition that varies monotonically from the composition of layer 1 to the composition of layer 3,
- layer 3 is formed on layer 2 and consists essentially of 3000–5000 Angstroms of 33.3%–66.7% chromium and 66.7%–33.3% copper,
- layer 4 is formed on layer 3 and consists essentially of 500–1000 Angstroms of chromium/copper with a composition that varies monotonically from the composition of layer 3 to the composition of layer 5, and
- layer 5 is formed on layer 4 and consists essentially of 1000–6000 Angstroms of copper.

10. The memory chip package of claim 9 in which the composition of layer 3 is approximately 50% chromium, 50% copper.

11. The memory chip package of claim 9 in which layer 1 is approximately 1500 Angstroms, layer 3 is approximately 4000 Angstroms, and layer 5 is approximately 3500 Angstroms.

12. A memory chip package containing at least one semiconductor memory chip, wherein said memory chip contains at least 1 million MOS memory cells each of which has a semiconductor charge storage site, and wherein said memory chip is mounted on an interconnect substrate using an area array of solder interconnections, and further wherein at least some of those solder interconnections are located within 150 $\mu$m of a semiconductor charge storage site, the invention characterized in that the solder material used for said solder interconnections is lead free and consists of at least 90% tin and is a eutectic composition ±5%.

13. The memory chip package of claim 12 further including at least one logic chip.

14. The memory chip package of claim 12 in which the interconnect substrate comprises a laminated organic material.

15. The memory chip package of claim 1 further including an underfill material between the said memory chip and the interconnect substrate, said underfill material being free of alpha particle sources.

16. The memory chip package of claim 1 in which the interconnect substrate for the said memory chip is the said logic chip.

* * * * *